(12) United States Patent
Guo et al.

(10) Patent No.: US 7,509,241 B2
(45) Date of Patent: Mar. 24, 2009

(54) METHOD AND APPARATUS FOR AUTOMATICALLY GENERATING A SITE MODEL

(75) Inventors: Yanlin Guo, Lawrenceville, NJ (US); Rakesh Kumar, Monmouth Junction, NJ (US); Stephen Charles Hsu, East Windsor, NJ (US); Harpreet Singh Sawhney, West Windsor, NJ (US)

(73) Assignee: Sarnoff Corporation, Princeton, NJ (US)

( * ) Notice: Subject to any disclaimer, the term of this patent is extended or adjusted under 35 U.S.C. 154(b) by 551 days.

(21) Appl. No.: 10/191,397

(22) Filed: Jul. 8, 2002

(65) Prior Publication Data

US 2003/0014224 A1    Jan. 16, 2003

Related U.S. Application Data

(60) Provisional application No. 60/303,492, filed on Jul. 6, 2001.

(51) Int. Cl.
| | |
|---|---|
| *G06F 17/10* | (2006.01) |
| *G06F 17/50* | (2006.01) |
| *G06T 15/00* | (2006.01) |
| *G06T 17/00* | (2006.01) |
| *G06T 15/10* | (2006.01) |
| *G06T 15/50* | (2006.01) |
| *G06K 9/00* | (2006.01) |

(52) U.S. Cl. ............... 703/2; 703/1; 703/7; 345/419; 345/420; 345/421; 345/423; 345/427; 382/154; 382/165

(58) Field of Classification Search ............... 345/418; 703/2, 7

See application file for complete search history.

(56) References Cited

U.S. PATENT DOCUMENTS

| | | | | | |
|---|---|---|---|---|---|
| 4,737,921 | A | * | 4/1988 | Goldwasser et al. | 345/421 |
| 5,259,037 | A | * | 11/1993 | Plunk | 382/154 |
| 5,467,444 | A | * | 11/1995 | Kawamura et al. | 345/441 |
| 5,692,061 | A | * | 11/1997 | Sasada et al. | 382/154 |
| 5,727,138 | A | * | 3/1998 | Harada | 345/420 |
| 5,754,180 | A | * | 5/1998 | Kivolowitz et al. | 345/418 |
| 5,887,083 | A | * | 3/1999 | Sumi et al. | 382/199 |
| 5,969,723 | A | * | 10/1999 | Schmidt | 345/428 |
| 6,052,124 | A | * | 4/2000 | Stein et al. | 382/154 |

(Continued)

OTHER PUBLICATIONS

Batty et al., "Visualizing the City: Communicating Urban Design to Planners and Decision-Makers," Oct. 2000, CASA, UCL.*

(Continued)

*Primary Examiner*—Kamini S Shah
*Assistant Examiner*—Akash Saxena
(74) *Attorney, Agent, or Firm*—Lowenstein Sandler PC

(57) ABSTRACT

A method and apparatus for automatically combining aerial images and oblique images to form a three-dimensional (3D) site model. The apparatus or method is supplied with aerial and oblique imagery. The imagery is processed to identify building boundaries and outlines as well as to produce a depth map. The building boundaries and the depth map may be combined to form a 3D plan view model or used separately as a 2D plan view model. The imagery and plan view model is further processed to determine roof models for the buildings in the scene. The result is a 3D site model having buildings represented rectangular boxes with accurately defined roof shapes.

26 Claims, 8 Drawing Sheets

U.S. PATENT DOCUMENTS

| | | | |
|---|---|---|---|
| 6,246,412 B1* | 6/2001 | Shum et al. | 345/419 |
| 6,256,409 B1* | 7/2001 | Wang | 382/170 |
| 6,665,439 B1* | 12/2003 | Takahashi | 382/165 |
| 6,985,628 B2* | 1/2006 | Fan | 382/165 |
| 7,027,653 B2* | 4/2006 | Hino et al. | 382/165 |
| 7,098,909 B2* | 8/2006 | Hayano et al. | 345/420 |
| 2001/0043738 A1 | 11/2001 | Sawhney et al. | 382/154 |
| 2002/0061132 A1* | 5/2002 | Furukawa | 382/154 |
| 2003/0132946 A1* | 7/2003 | Gold | 345/611 |
| 2006/0078205 A1* | 4/2006 | Porikli et al. | 382/204 |
| 2008/0040083 A1* | 2/2008 | Odry et al. | 703/2 |

OTHER PUBLICATIONS

Ross et al., "Multi-Sensor 3D Image Fusion and Interactive Search," May 2000, Massachusetts Institute of Technology Lincoln Laboratory.*

Gruen et al., "Acquisiition and Management of Urban 3D Data Using CyberCity-Modeler," Jul. 1999, Swiss Federal Institute of Technology.*

Zheltov et al., "Computer 3D Site Model Generation Based on Aerial Images," 1997, SPIE Proceedings, vol. 3084, pp. 336-343.*

Wikipedia definition: Photogrammetry Oct. 2007; http://en.wikipedia.org/wiki/Photogrammetric.*

Wikipedia definition: Digital elevation model Sep. 2007; http://en.wikipedia.org/wiki/Digital_elevation_model.*

Measuring corner properties Source; Paul L. Rosin; Computer Vision and Image Understanding;vol. 73 , Issue 2 (Feb. 1999); pp. 291-307; Year of Publication: 1999; ISSN:1077-3142.*

3D pose estimation by fitting image gradients directly to polyhedral modelsKollnig, H.; Nagel, H.-H.;Computer Vision, 1995. Proceedings., Fifth International Conference on Jun. 20-23, 1995 pp. 569-574.*

Frameless registration of MR and CT 3D volumetric data setsKumar, R.; Dana, K.; Anandan, P.; Okamoto, N.; Bergen, J.; Hemler, P.; Sumanaweera, T.S.; van den Elsen, P.A.; Adler, J.;Applications of Computer Vision 1994., Proceedings of the Second IEEE Workshop on Dec. 5-7, 1994 pp. 240-248.*

Guo et al., "Robust Object Matching for Persistent Tracking With Heterogeneous Features," IEEE Transacitons on Pattern Analysis and Machine Intelligence (PAMI), vol. 29, No. 5, pp. 824-839 (May 2007).

Kumar et al., "Aerial Video Surveillance and Exploitation," Proceedings of the IEEE 89 (10), pp. 1518-1539 (2001).

Vemuri et al., "Deformable Pedal Curves and Surfaces: Hybrid Geometric Active Models For Shape Recovery," International Journal of Computer Vision (IJCV), 44 (2), pp. 137-155 (2001).

Sawhney, et al., "Independent Motion Detection in 3D Scenes," IEEE Transactions on Pattern Analysis and Machine Intelligence (PAMI), vol. 22, No. 10, pp. 1191-1199 (Oct. 2000).

Vemuri, "Snake Pedals: Compact and Versatile Geometric Models with Physics-Based Control," IEEE Transactions on Pattern Analysis and Machine Intelligence (PAMI), vol. 22, No. 5, pp. 445-459 (May 2000).

Vemuri et al., "Fast Numerical Algorithms for Fitting Multi-Resolution Hybrid Shape Models to Brain MRI," Medical Imaging Analysis, vol. 1, No. 4, pp. 343-362 (Jul. 1996).

Yang et al., "Learning Actions Using Robust String Kernels," The Workshop on Human Motion, in conjunction with the International Conference on Computer Vision (ICCV), pp. 313-327 (Oct. 2007).

Jung et al., "Multiple Cue Integrated Action Detection," The Workshop on Human Computer Interaction, in conjunction with the International Conference on Computer Vision (ICCV), pp. 108-117 (2007).

Guo et al., "PEET: Prototype Embedding and Embedding Transition for Matching Vehicles over Disparate Viewpoints," International Conference on Computer Vision and Pattern Recognition (CVPR), Minneapolis MN (Jun. 2007).

Rao, et al., "A Heterogeneous Feature-based Image Alignment Method," International Conference on Pattern Recognition (ICPR), Hong Kong (2006).

Guo et al., "Robust Object Matching for Persistent Tracking with Heterogeneous Features," The Workshop on Visual Surveillance and Performance Evaluation of Tracking and Surveillance, in conjunction with the International Conference on Computer Vision (ICCV), Beijing, P.R. China, pp. 81-88 (Oct. 2005).

Guo et al., "Vehicle Fingerprinting for Reacquisition and Tracking in Videos," International Conference on Computer Vision and Pattern Recognition (CVPR), San Diego, CA, pp. 761-768 (Jun. 2005).

Fancourt et al., "Iris Recognition at a Distance," Audio- and Video-based Biometric Person Authentication (AVBPA), pp. 1-13 (Jul. 2005).

Guo et al., "Learning-Based Building Outline Detection from Multiple Aerial Images," International Conference on Computer Vision and Pattern Recognition (CVPR), vol. 2, pp. 545-552 (2001).

Sawhney et al., "Hybrid Stereo Camera: An IBR Approach for Synthesis of Very High Resolution Stereoscopic Image Sequences," SIGGRAPH, Los Angeles (2001).

Kumar et al., "3D Manipulation of Motion Imagery," International Conference on Image Processing (ICIP), Special Session, Digital Stereoscopic and 3D Imaging: From Research Lab to Mainstream Applications, Vancouver, BC, Canada, pp. 17-20 (Sep. 10-13, 2000).

Vemuri et al., "Hybrid Geometric Active Models for Shape Recovery in Medical Images," International Conference on Medical Image Computing and Computer-Assisted Intervention (1998).

Sawhney et al., "Independent Motion Detection in 3D Scenes," The 7th Conference on Computer Vision (ICCV), Kerkyra, Greece (Sep. 1999).

Sawhney et al., "Multi-View 3D Estimation and Application to Match Move," IEEE Workshop on Multi-View Modeling and Analysis of Visual Scenes, in conjunction with the International Conference on Computer Vision and Pattern Recognition (CVPR), Fort Collins, CO, pp. 21-28 (1999).

Vemuri et al., "Snake Pedals: Geometric Models with Physics Based Control," 6th International Conference on Computer Vision (ICCV), pp. 427-432 (2003).

Vemuri et al., "Fast Algorithms for Fitting Multiresolution Hybrid Shape Models to Brain MRI," The 4th International Conference on Visualization in Biomedical Computing (VBC), Hamburg, Germany, pp. 213-222 (Sep. 1996).

* cited by examiner

METHOD AND APPARATUS FOR AUTOMATICALLY GENERATING A SITE MODEL

CROSS-REFERENCE TO RELATED APPLICATIONS

This application claims benefit of U.S. provisional patent application Ser. No. 60/303,492, filed Jul. 6, 2001, which is herein incorporated by reference.

GOVERNMENT RIGHTS IN THIS INVENTION

This invention was made with U.S. government support under U.S. Navy Contract Number N0001999C1385. The U.S. government may have certain rights in this invention.

BACKGROUND OF THE INVENTION

1. Field of the Invention

The invention relates to image processing and, more particularly, relates to techniques for automatically generating a site model from images of a site.

2. Description of the Related Art

The mainstay of geographical information systems is the depiction of land occupied by buildings using a two-dimensional map. Increasingly, there is a need for three-dimensional (3D) representations of buildings to augment the geographical information. Such 3D information may be required in architectural design application and wireless infrastructure planning applications. Ideally, geographical information should contain a database encompassing extensive areas of land (e.g., suburban residential areas) while containing details about the shape and texture of each building from all vantage points.

Using commercially available software, the process of extracting information for creating such a database is labor-intensive. Typically, the process uses a series of aerial images recorded viewing a scene from above, e.g., a plurality of aerial photographs of a neighborhood. Typical aerial photographs lack sufficient information for complete 3D modeling of a building's shape and appearance. However, the aerial photographs can be augmented with information from a plurality of high-resolution, oblique photographs of the scene (site). A manual process is currently used to outline buildings in the aerial photographs and then identify oblique information that corresponds to the building outlines. The oblique information (e.g., a building's shape and texture, is manually aligned with the outlines to prepare a 3D view of the building(s). Because the process is so time consuming, the process is generally used for only a select number of buildings.

Therefore, there is a need in the art for techniques for generating 3D site models using automated processes to provide more comprehensive site models.

SUMMARY OF THE INVENTION

The disadvantages of the prior art are overcome by a method and apparatus for automatically combining at least one of aerial images and/or oblique images to form a three-dimensional (3D) site model. The apparatus or method is supplied with aerial and/or oblique imagery. The imagery is processed to identify building boundaries and outlines as well as to produce an elevation map. The building boundaries and the elevation map may be combined to form a 3D plan view model or used separately as a 2D plan view model. The imagery and plan view model is further processed to determine roof models for the buildings in the scene. The result is a 3D site model having buildings represented rectangular boxes with accurately defined roof shapes. Further processing may be performed to apply texture to the walls of the buildings to match the texture of the oblique imagery.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
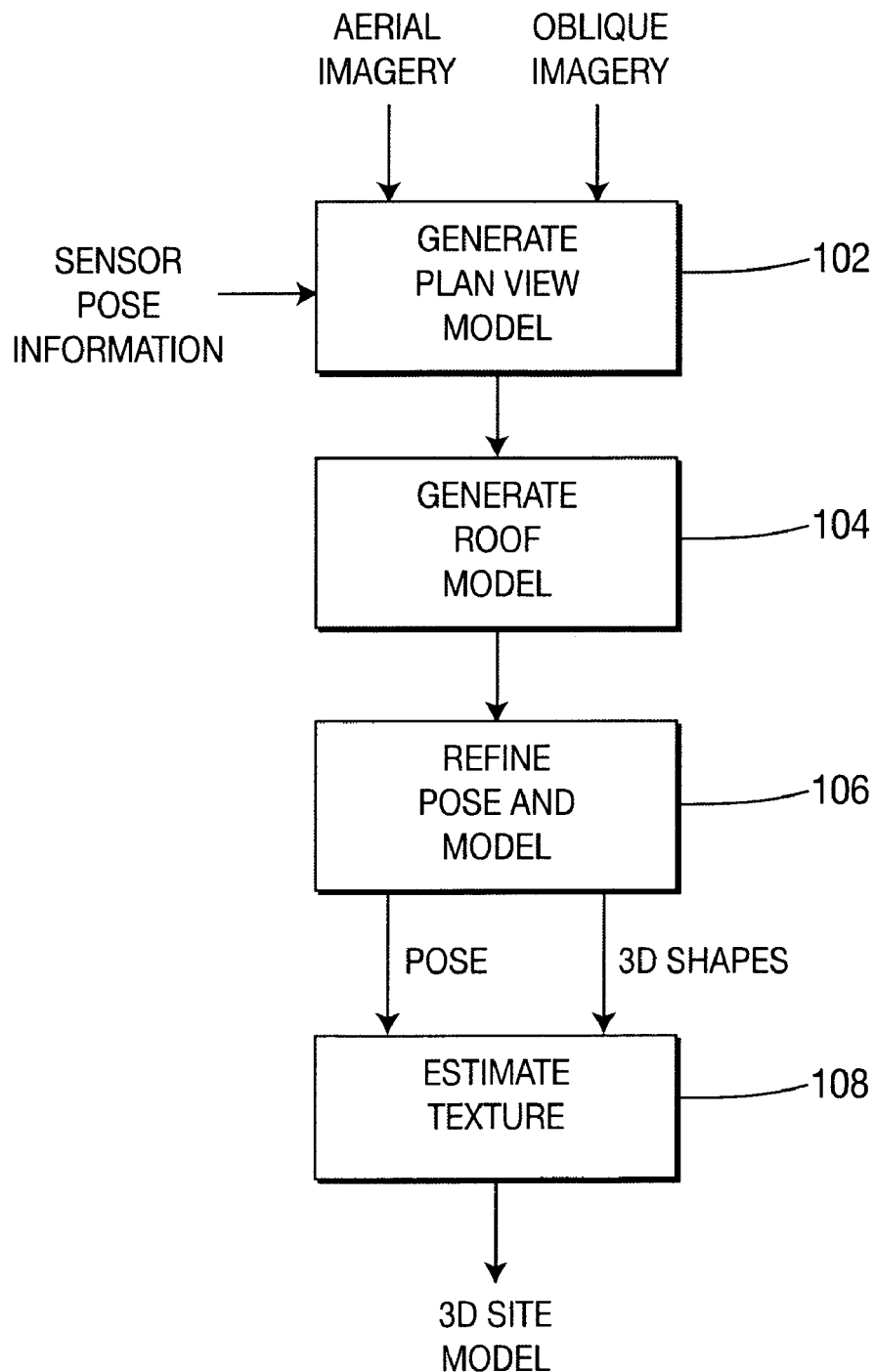
FIG. 1 depicts a high-level flow diagram of one embodiment of a method of the present invention.

FIG. 1 depicts a high-level flow diagram of one embodiment of a method 100 of the present invention. The method 100 is supplied with at least one of aerial imagery and oblique imagery of a scene as well as pose information regarding the sensors used to produce both the aerial and oblique imagery. The aerial imagery is produced from above the scene in a substantially vertical orientation, e.g., an aerial video image taken from an airplane. The aerial imagery is generally acquired using large format, film-based still photography, digital scanners or one or more video cameras. Alternatively, the imagery can be produced by creating a mosaic comprising a plurality of small format photographs or video frames.

The oblique imagery is generated by a film or digital still camera(s) or at least one video camera. However, to produce high quality textured 3D models, the oblique imagery is generally video captured from a continuously moving platform that provides gap-free coverage and high similarity between successive images. The sensor pose information (i.e., camera location and orientation) for both the cameras used for aerial imagery generation and oblique imagery generation should be recorded or computed to increase the accuracy and automation of the modeling process. As shall be discussed below, 3D model generation may be performed without the pose information; however, pose information does enhance the process. The pose information may be acquired using a Global Positioning System (GPS) receiver, an inertial navigation system (INS), and camera parameter recorders.

At step 102, the aerial and/or oblique imagery is processed to generate a plan view model of the scene. The plan view model is either a two-dimensional (2D) or three-dimensional (3D) model of the scene that contains building outlines and internal break lines as well as scene elevation information. At step 104, the oblique imagery is used to generate a roof model. The roof model adds information to the plan view model to provide a model that contains building shapes, building heights and accurate roof lines for the buildings. At step 106, the pose information is used to iteratively refine the pose and model. The iterative process aligns the aerial and oblique imagery with the roof model and updates the model. The process is performed using a "global" reference coordinate system that is common to the various cameras used to produce imagery of the scene. The coordinate system may be geographically defined such that the ultimate 3D site model can be integrated with geographic information databases.

At step 108, the method estimates the texture to apply to the model using the accurate pose and 3D shapes of the buildings. The texture is generally extracted from the oblique imagery such that the 3D model has exceptional realism. The output is a 3D site model of the scene having the buildings within the scene accurately rendered with respect to shape, size and texture.

Figure 2:
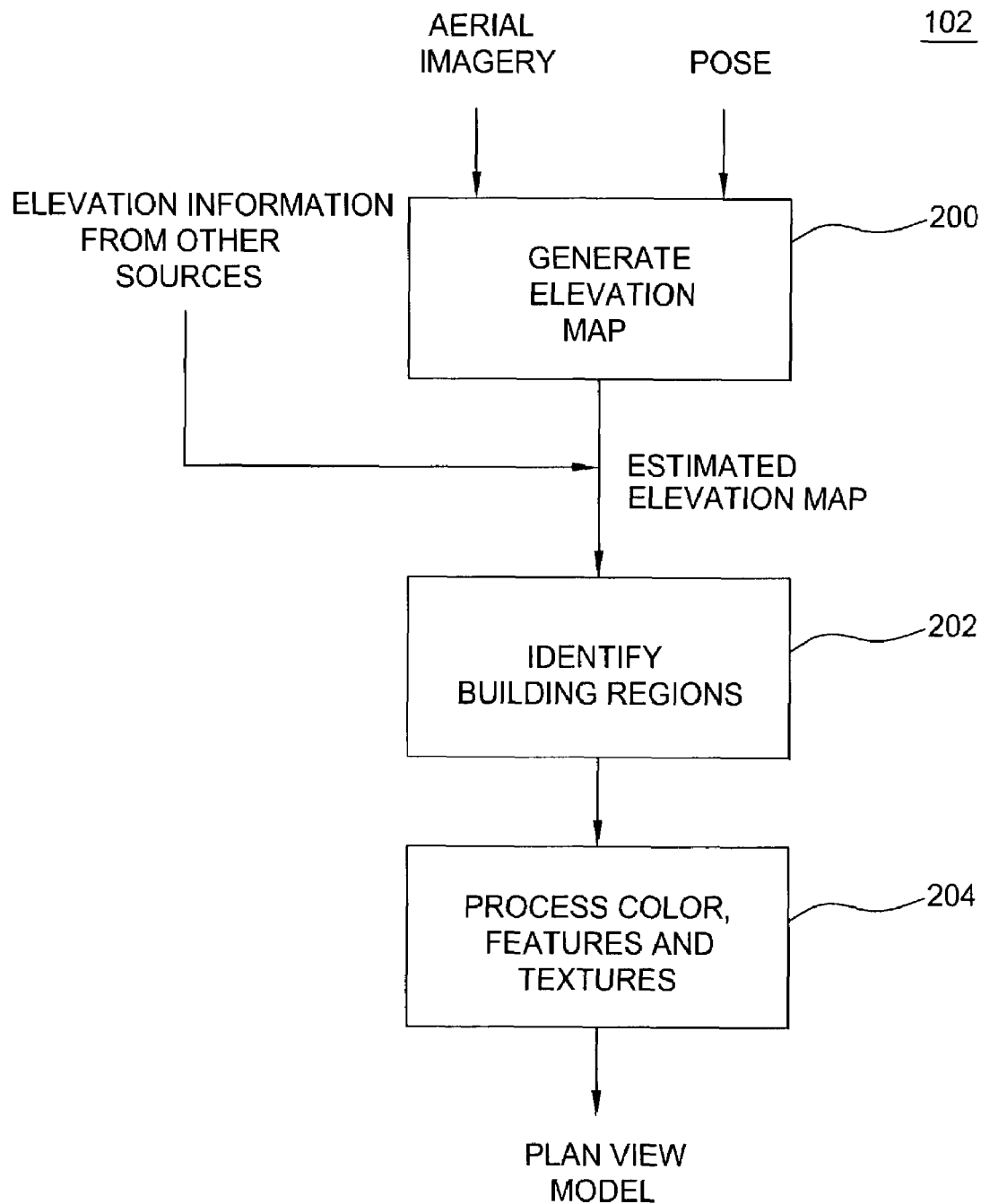
FIG. 2 depicts a detailed flow diagram of one embodiment of a method for generating a plan view model.

FIG. 2 depicts a detailed flow diagram of one example of an embodiment of step 102 that generates a plan view model of a scene using aerial imagery. This process produces a 2D rectilinear model and elevation information for the buildings within the scene. In step 200, the method generates an elevation map from the aerial imagery. Generally aerial imagery is used because such a view minimizes occlusion of buildings from obstructions such as trees and other buildings. Alternatively, the elevator information (the distance from the camera to the scene elements or objects, e.g., buildings) may be provided by a range sensor such as LADAR data, IFSAR and the like. For the remainder of this discussion, it is assumed that such elevator information is derived from the imagery itself rather than provided by a separate sensor.

The estimated elevation map comprises a dense elevation map since the aerial imagery is substantially vertical. The information contained in the map is extracted from one or more pairs of stereo images. The stereo images may be acquired using a stereo video or still camera, or they may be derived using a pair of video frames or still images that are spatially offset, but image the same scene. In either instance, the images are calibrated to one another such that the spatial relationship (relative pose) of the cameras forming the images is known. There are many well-known techniques that can be used to extract an elevation map from one or more pairs of calibrated stereo images.

In step 202, the elevation map is processed to identify building regions. Connected regions within the elevation map whose elevation is significantly higher than the surrounding regions are deemed to be possible building regions. These connected regions are represented by polygons, i.e., polygon regions are traced around the regions following high edge energy patterns in both the elevation map and the input aerial imagery.

In step 204, the method processes the aerial imagery using the polygons as an indicator of building outlines. Step 204 uses a classifier that analyzes the color, features and textures within the imagery. For example, by analyzing color, texture and edge features, the method can suppress from the imagery non-buildings such as trees. The output is a plan view model comprising a set of polygons along with mean elevation in each polygonal region, all defined in a common coordinate system (e.g., a ground coordinate system).

Figure 3:
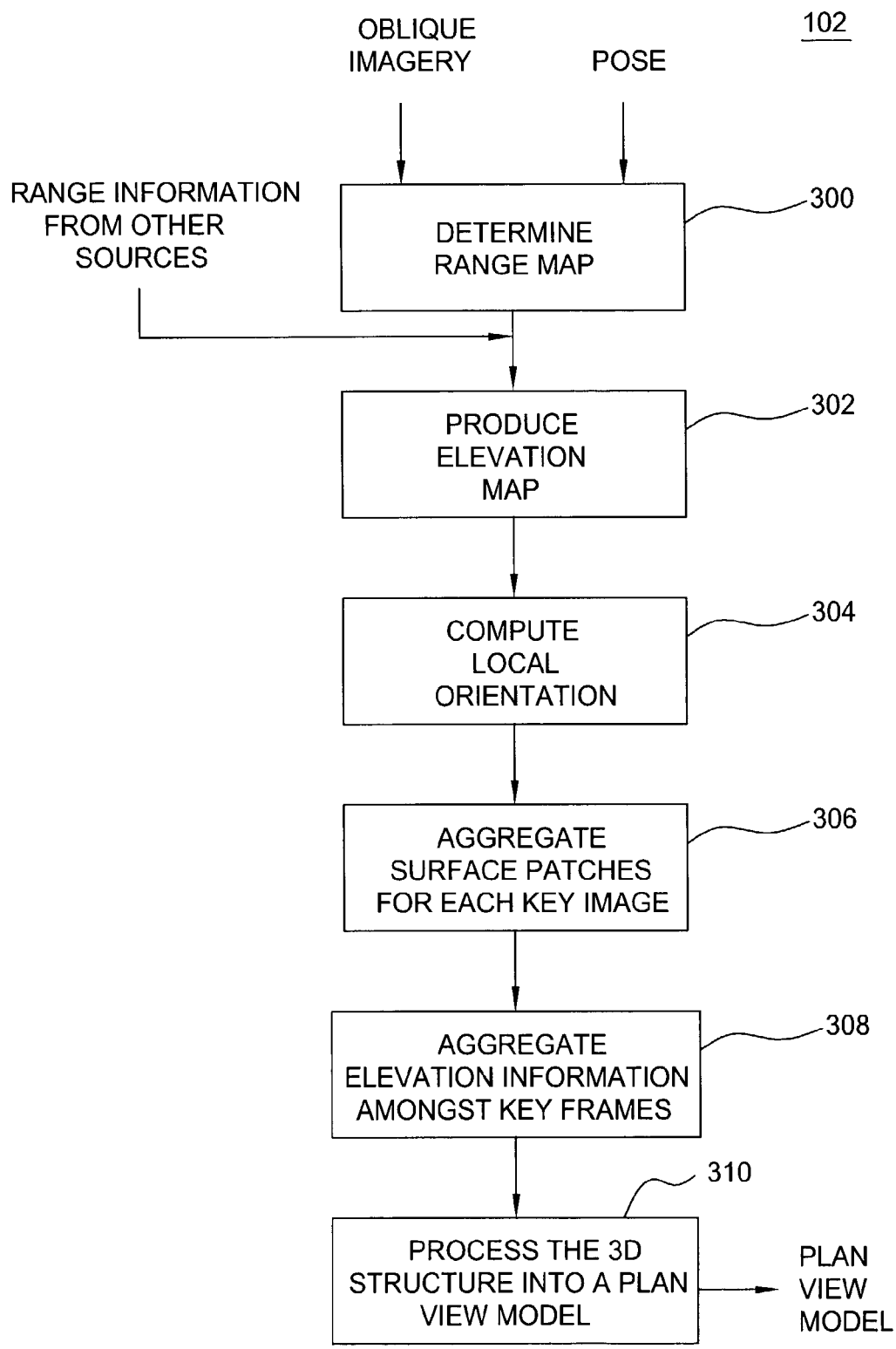
FIG. 3 depicts a detailed flow diagram of another embodiment of a method for generating a plan view model.

FIG. 3 depicts a detailed flow diagram of one example of an embodiment of step 102 that generates a plan view model of a scene using oblique imagery. This process produces a 3D site model comprising a number of rectangular cylinders (boxes) that represent the shape, size and height of each building within the scene. The following discussion assumes that the oblique imagery is a sequence of video frames (referred to herein as video). Other forms of imagery may also be used by this method to form a plan view model.

In step 300, the oblique imagery and the camera pose are processed to determine a range map. This is generally performed as discussed with respect to step 200 of FIG. 2 using well-known stereo image processing techniques. Range information may also be provided from other sources.

In step 302, the range information, imagery and pose are used to produce an accurate elevation map or maps of the scene. This is generally performed for key video frames using any one of the many well known motion stereo algorithms. Performing an absolute orientation between various elevation maps of a scene may be used to refine the pose.

In step 304, the method computes local orientations of surface patches for the elevation information recovered from the key video frames. Each key frame will have an elevation map that is analyzed for the local orientations of the surface patches.

In step 306, the surface patches within each elevation map are aggregated with respect to the 3D orientation of the local orientations. The aggregation process forms planes of similarly oriented surface patches.

In step 308, the method aggregates depth information amongst key frames. For example, vertical elevation planes associated with different key frames are aggregated into a single global 3D structure. Alternatively, steps 306 and 308 may be reversed in order such that the global structure may be produced and then surface patches identified to form planes.

In step 310, the 3D structure is processed to create the plan view model. Specifically, the 3D model is projected to a plan view and a graphical analysis is performed to recover the plan view model.

In one particular process for identifying building, at the prospective location of the buildings within the 3D structure, an initial rectangular template, approximated by a rectangle with proper orientation and scale, is instantiated. The template is further deformed to incorporate more edges to precisely depict building protrusions and concavities. The size and orientation of the initial rectangle is obtained by computing the first and second order moments of each building region. However, the building orientation does not necessarily conform to the dominant orientation of the building. The orientation is refined by computing an orientation histogram (modulo to 90°) within each building and select the angle with the strongest peak as the dominant orientation. The orientation histogram is computed using orientations of image gradients. Note that only salient orientation features with large enough magnitude in the combined gradient field of image intensity and depth map are considered.

Let $I(x, y)$ and $D(x, y)$ be the image intensity and depth at point $(x, y)$, and let $I_x = I_x(x, y)$, $I_y = I_y(x, y)$, $D_x = D_x(x, y)$, and $D_y = D_y(x, y)$ be their gradients in x and y directions respectively, the combined gradient field is defined as:

$$G(x, y) = (\sigma_1 \cdot \sqrt{I_x^2 + I_y^2}) \cdot (\sigma_2 \cdot \sqrt{D_x^2 + D_y^2}) / \sigma_3, \quad (1)$$

where $\sigma_1$ and $\sigma_2$ are used to normalize image and elevation map respectively so that their values fall into the same range, and $\sigma_3$ normalizes the combined image value to the range of [0 1]. Most building outlines become clearly marked as pixels with high gradient magnitude values. The gradient of image intensity itself is quite noisy, and consists of a lot of local fragments such as the edges depicting small structures on the roof. On the other hand, the gradient of the elevation map itself tends to be too rough and misses structures like small protrusions of buildings.

Figure 7:
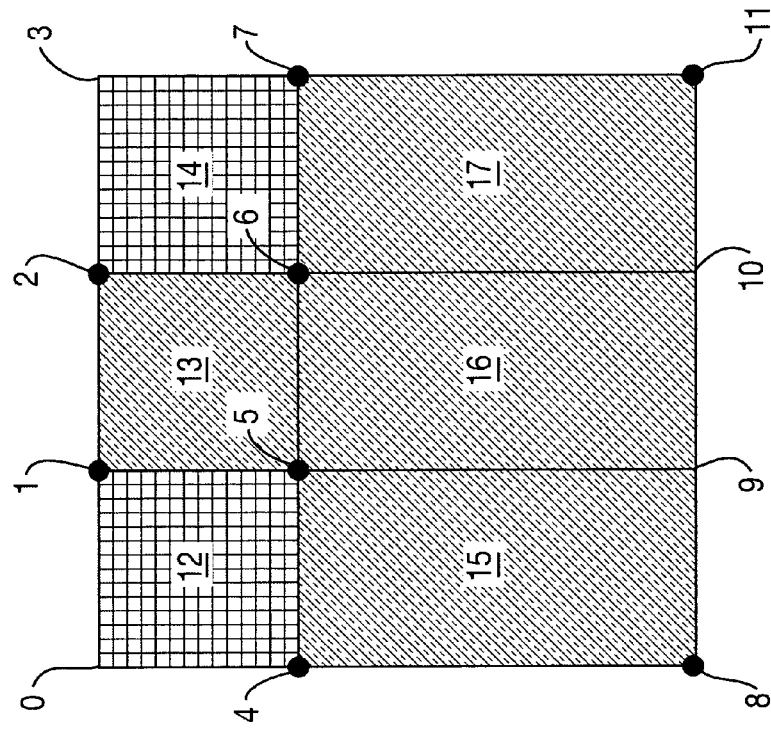
FIG. 7 depicts a knot point detection and path finding result.

The combined gradient field represents the building structures at the appropriate scale. The combined gradient field is also used to create the initial rectilinear templates of buildings from the rough rectangular templates. The rectilinear template creation process first requires the identification of the knot points within each rectangle. The method integrates $G(x,y)$ both along and perpendicular to the dominant orientation, and fit straight lines to the local maximum along each direction, the candidate knot points are detected as the crossing points of these straight lines. FIG. 7 is a graphical depiction of a region of an image where straight lines have been fitted along the local maximums. Integration along line segments connecting points 1 and 9, 2 and 10, and 4 and 7 are detected as local maximum, their intersecting points 5 and 6 are identified as knot points.

Given the candidate knot points, the method can divide the original rectangular template into several smaller rectangles. For example, in FIG. 7, the whole template is subdivided into 6 rectangles marked with number 12-17. The method checks if every component rectangular area falls within a building region.

This involves the comparison of the average elevation $\bar{d}$ for the whole region with $\bar{d}_r$ for each small area. After validating component rectangles, the next step is to traverse them to find the rectilinear outlines.

Figure 8:
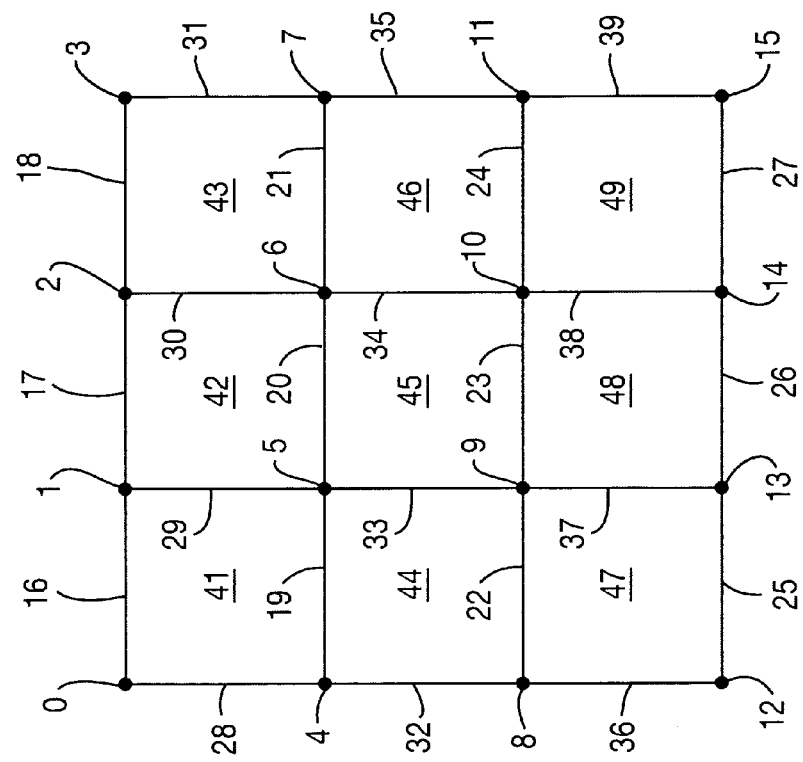
FIG. 8 depicts a rectilinear template graph.

A simple graph shown in FIG. 8 is built for this purpose. In this graph, every, rectangle area (numbered rectangle 41-49) has four line segments and four vertexes; every line segment has one start and one end vertex, and is attached to two small rectangles; and every vertex belongs to four rectangles and connects to other vertices through four line segments. With this graph, starting from an initial line segment, a rectilinear template that contains all the valid component rectangles can be found by following the following rules when searching for the next line segment:
  (i) Only line segments separating valid and invalid building areas are considered as building edges. Regions that are out of the overall rectangular area are considered to be invalid areas.
  (ii) Always prefer 90° turns rather than 0° turns.
  (iii) Always prefer to cover different small areas when searching for the next line segment.
  (iv) No line segment should be traversed twice.

It is easy to prove that if there are no holes inside the building (such as a courtyard), a path obtained by this set of rules is optimal. A typical result is shown in FIG. 7. The outline is shown by lines that connect vertices 1-2-6-7-11-10-9-8-4-5-1. The method also performs vertex merging so that the path becomes 1-2-6-7-11-8-4-5-1. An exhaustive search with limited search range is employed to finely adjust the orientation and position of each of the line segments. The result is an accurate plan view model comprising outlines of the building within the site.

The plan view model comprises geometry information regarding a scene, i.e., building locations, shapes and heights are modeled as, in essence, a set of rectangular boxes. In some applications, a 2D model of the scene or an untextured 3D model of a scene is sufficient as a site model. In these situations, the plan view model is output as the site model. To enhance an untextured 3D model, basic roof structures and computer-generated textures could be added.

Figure 4:
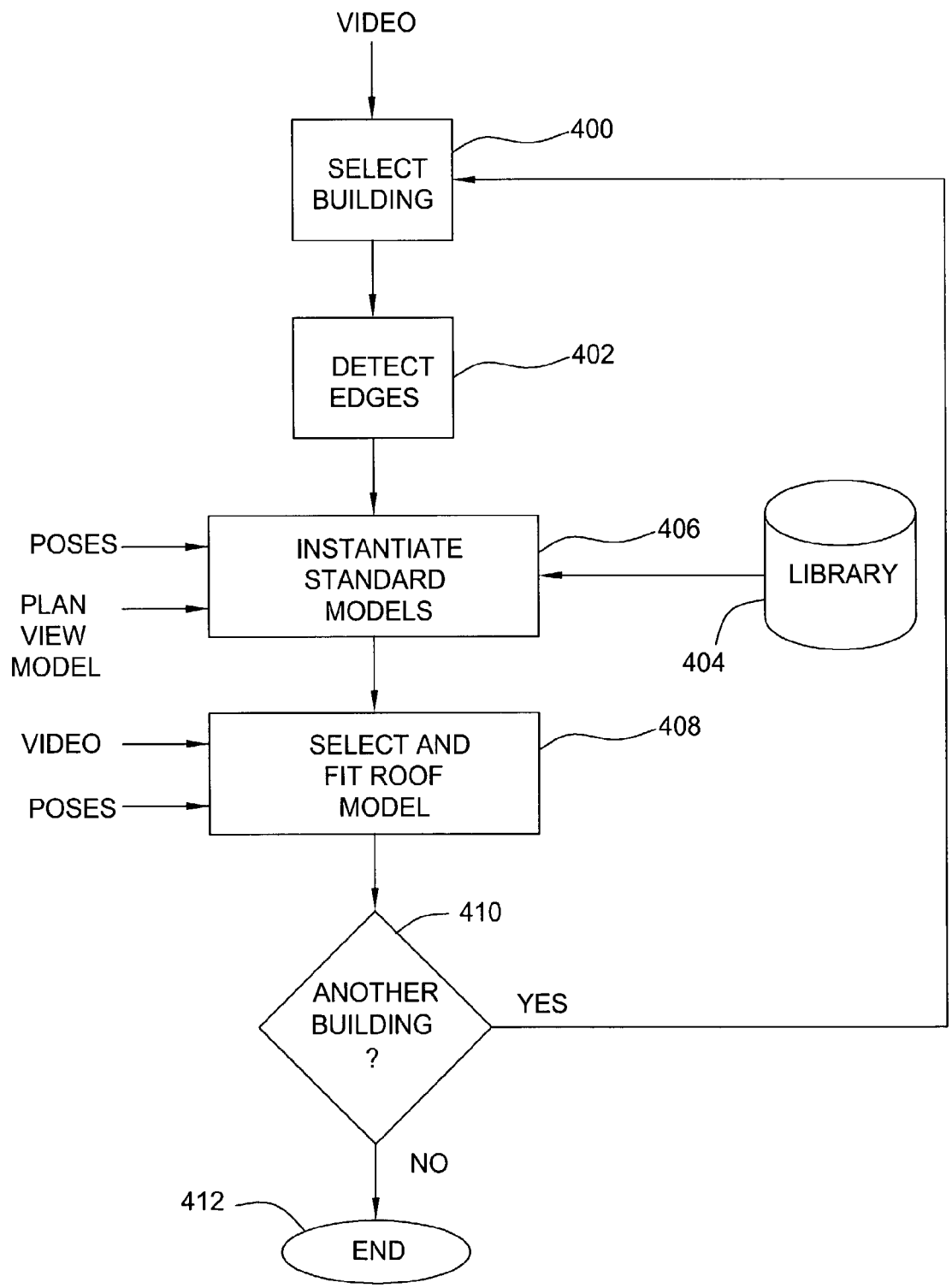
FIG. 4 depicts a detailed flow diagram of one embodiment of a method for generating a roof model.

To add realism to the plan view model, step 104 of FIG. 1 is used to add an accurate roof structure for each building using the oblique imagery. FIG. 4 depicts a detailed flow diagram of one embodiment of a method used to implement the function of step 104. The method fits a library of standard parameterized roof shapes (e.g., flat, hip, saddle and the like) to the imagery and the plan view model. To facilitate roof selection, the method requires only a partial view of the roof. As such, a complete 360 degree view of the building is not required to select a roof.

Initially, each building is separately defined as a cylinder (generally a rectangular box) whose base is the previously estimated outline of the building from the plan view model and the height is the previously estimated mean height plus a tolerance that is part of the plan view model. Alternatively, if the height of the building is unavailable or believed to be inaccurate, the height of a particular building may be set to a known maximum height for the buildings in the region.

In this embodiment of the invention, the process operates upon one building at a time, beginning with the building that is most visible, i.e., least occluded, from all the available oblique images. The most visible building in the oblique imagery (video) is selected at step 400 for processing. Those skilled in the art may define other criteria for selecting a building for processing.

To process the selected building, the method 104 executes step 402 wherein the image edges pertaining to the selected building are detected. The edges are detected using, for example, a Canny line filter. The detected edges from every view of the building are projected onto the existing building model (e.g., the cylinder outline). Image edges corresponding to true 3D line features lying on the model's walls will tend to form clusters, while those corresponding to 3D features belonging to other surfaces will tend to disperse.

All available roof models are stored in library 404, a computer database of parameterized roof models. A particular subset of roof models in the library 404 that is most consistent with the pattern of line clusters is taken to be a set of candidate roof model hypotheses. The initial selection of the subset is performed in step 406. Using the poses, the plan view model and the library, the method instantiates the standard models to select the subset of roof model hypotheses.

To choose among the candidate hypotheses, the method executes step 408 to select and fit the candidate roof models. To facilitate the fitting process, many pairs of oblique images are aligned using their known 3D poses and the 3D shape of each roof model hypothesis. The two oblique images in each pair should be near one another in pose to minimize appearance and occlusion changes between the images. However, the collection of image pairs should be spread out as much as possible to cover the building from various viewpoints. The hypothesis that provides the minimum total image alignment error is accepted as the building roof model.

At step 410, the method queries whether another building is to be processed. If the query is negatively answered, the method ends at step 412. If the query is affirmatively answered, the method returns to step 400 to select another building. The next building selected is chosen based on visibility, where the initial cylinders for each building are now replaced by an updated cylindrical model with an estimated shape having a roof.

The output of the method of step 104 is a 3D model having a plurality of cylindrical buildings with accurate roof models, i.e., an untextured 3D solid model. Such a 3D solid model forms a 3D site model that can be further processed and textured using steps 106 and 108 of FIG. 1. Such texturing is disclosed in detail in U.S. patent application Ser. No. 09/800,550, filed Mar. 7, 2001 wherein various techniques for aligning oblique video with a model are disclosed.

The foregoing process relied upon a library of predefined roof models. However, if the oblique imagery contains sufficient views of the roofs of the buildings, the shape of the roofs can be derived directly from the video, i.e., a model-independent technique.

Figure 5:
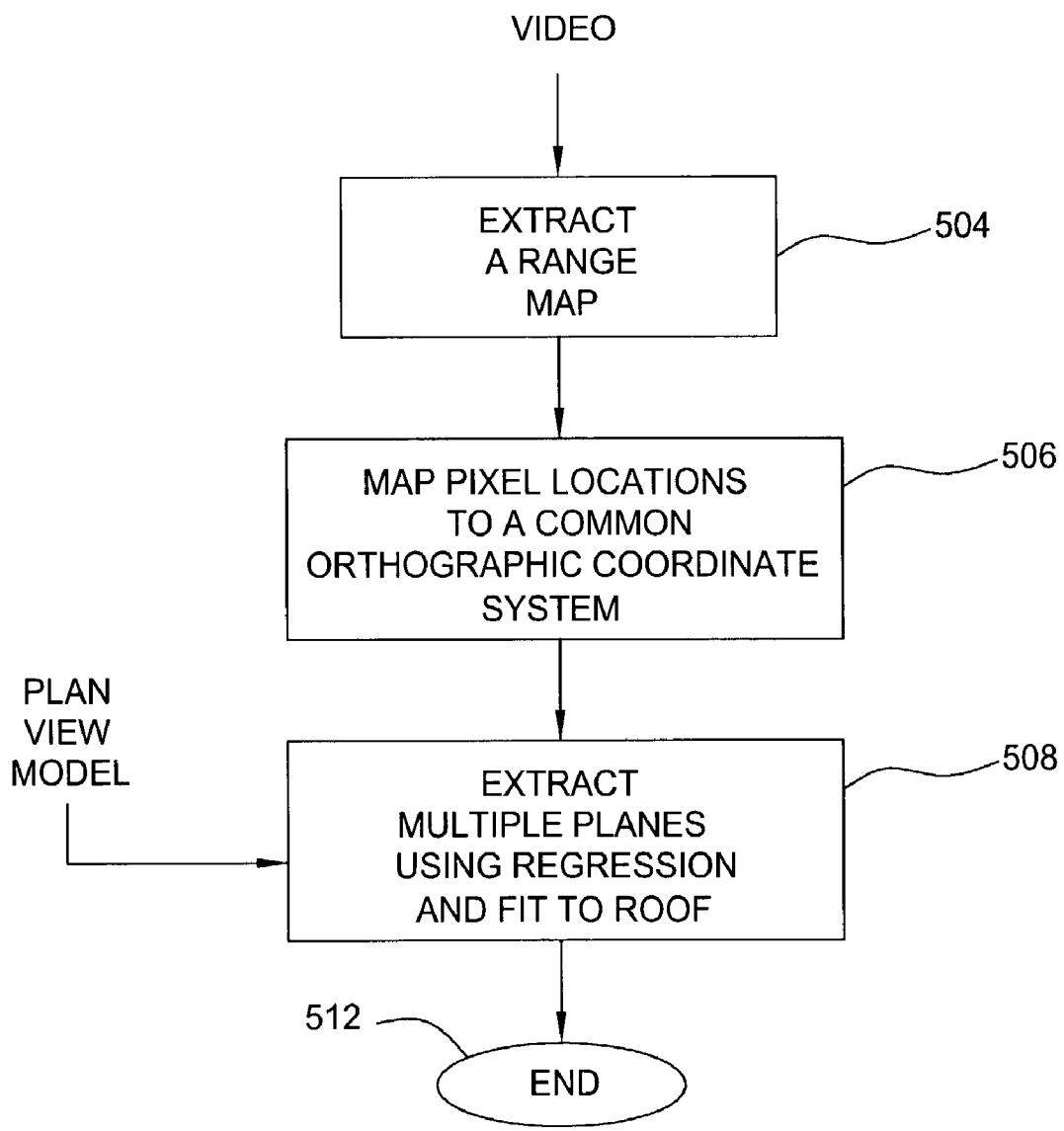
FIG. 5 depicts a detailed flow diagram of another embodiment of a method for generating a roof model.

FIG. 5 depicts a flow diagram of an embodiment of a method 500 of generating roof models using a model-independent technique.

At step 504, the method 500 extracts a range map from each of several pairs of images of the selected building in the video (oblique imagery). In step 506, the 3D pixel locations in the range map are mapped to a common orthographic coordinate system. This yields an elevation map resembling one obtained from vertical images, except with higher resolution. At step 508, robust regression extracts one or more planes and fits the planes to the roof of the buildings. There are many well known techniques for performing robust regression, such as Random Sample Consensus (RANSAC). While regression generally provides accurate plane orientation parameters, the spatial support of each planar segment may not be clearly determined; thus, the support (the exact boundary) is adjusted to coincide with the 3D intersection lines of adjoining segments. As such, the planar roof "panels" for the buildings are derived for the 3D site model from the oblique imagery.

The method 500 ends at step 512. The output of the method 500 is a 3D solid model having buildings modeled as rectangular boxes with accurately depicted roof lines.

Figure 9:
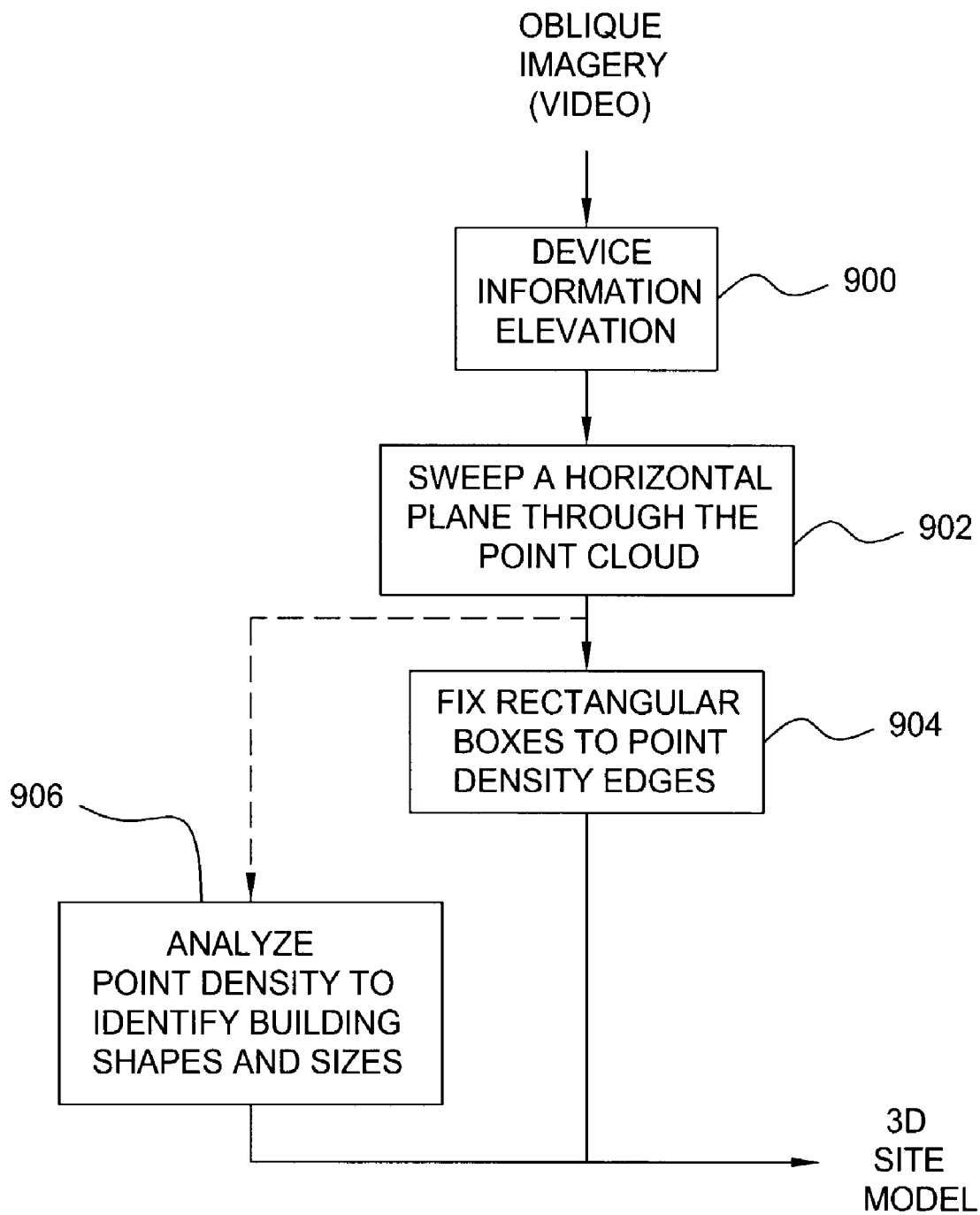
FIG. 9 depicts a flow diagram of another embodiment of a method for generating a 3D site model in accordance with the invention.

FIG. 9 depicts a flow diagram of another embodiment of the invention wherein the 3D site model is derived directly from the oblique imagery. At step 900, range information is derived from the input video. This is performed using well known stereo image processing. The result is a dense collection of point clouds having a common coordinate system.

At step 902, a horizontal plane is vertically swept through the point cloud. The intersection of the high density point cloud with the plane identifies the walls of buildings. The intersection identifies the location of "point density edges" within the cloud. Sweeping the plane completely through the building roof will provide the location of the roof as well.

At step 904, rectangular boxes are fitted to the point density edges to form the 3D site model.

Alternatively, the point density can be analyzed to directly derive the building shapes and sizes. At step 906, a vertically oriented plane may be swept through the point cloud to identify point density planes that represent walls of buildings. Further planes of various orientations can be swept through the cloud to identify other surfaces such as roof lines. Each plane of point density can be represented by a planar wall. The accumulation of such walls forms a complete 3D site model.

For some applications, such as wireless infrastructure planning, only the 3D shapes of the buildings in the site are of interest. In other applications, such as scene visualization, a 3D surface appearance needs to be extracted from the imagery of the scene and applied to the model. Vertical images capture mainly roof, while oblique and ground level images capture walls as well as additional roof information. The derived pose of each image and the 3D scene shape are used to project image pixels from the oblique imagery onto the model. Where two or more images see the same surface patch, there may be some image misalignment due to errors in the 3D camera poses or 3D shape. The misalignment can be minimized by joint refinement of the poses and the shape. This will form a corrected 3D site model. Alternatively, the misalignment could also be corrected using 2D registration of images along each surface of the 3D site model.

Implicit in all the foregoing processes for plan view structure determination, 3D shape modeling, and texture extraction is knowledge of pose of each camera in a common coordinate system, including both exterior orientation (position and rotation) and camera intrinsic parameters (focal length, principal point, aspect ratio, skew, lens distortion). Pose sensors (GPS, INS, camera instrumentation) may supply the information with sufficient accuracy or at least provide initial values for image-based pose estimation. The pose of vertical images can be computed by conventional photogrammetric bundle adjustment, using image to image tiepoints and ground control points, or by georegistration of the vertical images to previously geocalibrated reference orthophotos. Oblique aerial and ground level images are difficult to georegister because the appearance of buildings at close range and from the side cannot be predicted from orthophotos. Photogrammetric bundle adjustment can be employed to reconstruct 3D pose and points relative to the cameras, but not with respect to the ground coordinate system, for lack of correspondences between the images and the ground. Moreover, the reconstruction can distort away from metric accuracy when too few points are visible over the entire image collection. What is known, however, are the true 3D positions of the walls, as determined by plan view analysis. The constraint that reconstructed 3D points corresponding to wall features must lie on those known planes can be used to recover absolute orientation of the reconstruction. Furthermore, the constraint can be incorporated into bundle adjustment itself to reduce the reconstruction's distortion.

Figure 6:
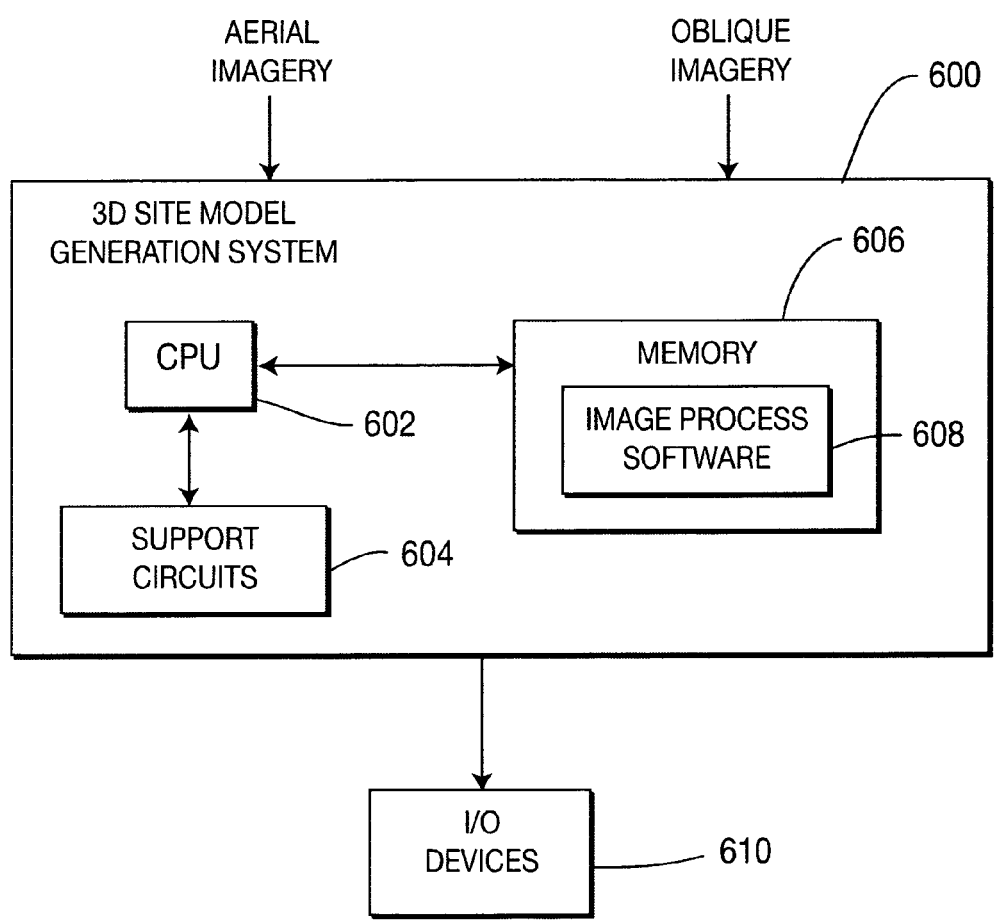
FIG. 6 depicts a block diagram of one embodiment of a three-dimensional site model generation system of the present invention.

FIG. 6 depicts a block diagram of one embodiment of a 3D site model generation system 600 of the present invention. The system 600 comprises a central processing unit (CPU), a memory 606, and various support circuits 604. The memory 606 may be any form of memory including, but not limited to, hard disk, removable memory, read only memory, random access memory, and the like. The memory 606 stores the image process software 608 that when executed causes the system 600 to perform the methods discussed above for generating 3D site models from aerial and oblique imagery. The support circuits 604 comprise well known circuits such as cache, clocks, power supplies and the like.

The system 600 may be coupled to input/output (I/O) devices 610 such as a keyboard, mouse, display, track ball, printer, network card, and the like. The CPU 602, memory 606 and support circuits 604 form a general purpose computer that executes software stored in the memory 606 such that the general purpose computer becomes a specific purpose computer. Alternatively, the system 600 may be completely or partially a specific purpose computer such as an application specific integrated circuit.

While foregoing is directed to the preferred embodiment of the present invention, other and further embodiments of the invention may be devised without departing from the basic scope thereof, and the scope thereof is determined by the claims that follow.

The invention claimed is:

1. A method tot generating a three-dimensional site model of a site that contains objects comprising:
   (a) providing at least one of aerial imagery and oblique imagery of the site;
   (b) processing at least one of the aerial imagery and the oblique imagery to generate a plan view model comprising object outlines,
   wherein said processing further comprises producing an elevation map using key video images; analyzing the elevation map to identify surface patches; computing local orientation of the surface patches within the elevation map, aggregating the surface patches for the key video images with respect to the local orientation of the surface patches; aggregating elevation information amongst the key video images to produce a three-dimensional structure; processing the three-dimensional structure into a plan view model; and (c) producing from the plan view model a three-dimensional site model comprising blocks that represent objects within the site, wherein the objects within the site include at least one building, the rectilinear outline of the at least one building being determined by:

computing an orientation histogram for the initial rectangle representing the building and selecting the angle of orientation with the strongest peak as the dominant orientation of the building;

computing a gradient field based on image intensity of the building;

integrating the gradient field along and perpendicular to the dominant orientation of the building;

fitting straight lines to local maximums of the gradient field along a each direction;

detecting knot points at the crossings of the straight lines;

dividing the initial rectangle into a plurality of smaller rectangles based on the knot points; and traversing the smaller rectangles to find the rectilinear outline of the building.

2. The method of claim 1 further comprising:
(d) processing the oblique imagery to generate elevation information regarding the objects within the site.

3. The method of claim 1 wherein step (b) further comprises:
(b1) identifying object regions within the elevation map; and
(b2) processing the object regions by classifying color, features and texture within said object regions.

4. The method if claim wherein the objects in the site are buildings and the method further comprises:
(d) processing the oblique imagery to produce a roof model for each building in the site.

5. The method of claim 4 wherein step (d) further comprises:
(d1) selecting a building within the site;
(d2) detecting edges of the building within the oblique imagery;
(d3) identifying a set of roof model hypotheses that correspond to the edges; and
(d4) selecting and fitting each roof model hypothesis to the oblique imagery to identify a roof model hypothesis as the roof model.

6. The method of claim 5 wherein the step (d1) selects a building based upon visibility within the oblique imagery.

7. The method of claim 4 wherein step (d) further comprises:
(d1) selecting a building within the site;
(d2) extracting a range map from the oblique imagery;
(d3) mapping pixel locations within the range map to a common orthographic coordinate apparatus; and
(d4) extracting multiple planes from the range map using regression to fit the planes to form a roof model.

8. The method of clam 1 further comprising receiving elevation information from an elevation information source.

9. The method of claim 1 further comprising:
(d) deriving elevation information from the oblique imagery;
(e) sweeping a horizontal plane through a point cloud in the elevation information
(e1) identifying intersections of the point clouds with the horizontal plane to determine edges of the point density within the point cloud;
(f) processing a point density to identify object locations within the site.

10. The method of claim 9 wherein step (f) further comprises:
(f1) fitting rectangular edges of boxes to the point density, where the rectangular boxes represent objects within the site.

11. The method of claim 9 wherein step (f) further comprises:
(f1) analyzing the point density to identify object shapes and sizes.

12. The method of claim 11 wherein step (f1) further comprises:
(f11) sweeping at least one additional plane through the point cloud in the elevation information to produce point densities representing planes of objects within the site.

13. The method of claim 1 wherein the plan view model is produced using graphical analysis.

14. Apparatus for generating a three-dimensional site model of a site that contains objects comprising:
(a) means for providing at least one of aerial imagery and oblique imagery of the site;
(b) means for processing at least one of the aerial imagery or the oblique imagery to generate a plan view model comprising object outlines,
wherein processing fun her comprises means for producing an elevation map using key video images; means for analyzing the elevation map to identify surface patches; means for computing local orientation of the surface patches within the elevation map; means for aggregating the surface patches for the key video images with respect to the local orientation of the surface patches; means for aggregating elevation information amongst the key video images to produce a three-dimensional structure; and means for processing the three-dimensional structure into a plan view model; and
(c) means for producing from the plan view a three-dimensional site model comprising blocks that represent objects within the site,
wherein the objects within the site include at least one building the rectilinear outline of the at least one building being determined by:
computing an orientation histogram for the initial rectangle representing the building and selecting the angle of orientation with die strongest peak as the dominant orientation of the building;
computing a gradient field based on image intensity of the building;
integrating the gradient field along and perpendicular to the dominant orientation of the building;
fitting straight lines to local maximums of the gradient field along each direction;
detecting knot points at the crossings of the straight lines;
dividing the initial rectangle into a plurality of smaller rectangles based on the knot points; and
traversing the smaller rectangles to find the rectilinear outline of the building.

15. The apparatus of claim 14 further comprising:
(d) means for processing the oblique imagery to generate depth information regarding the objects within the site.

16. The apparatus of claim 14 therein means (b) comprises:
(b1) means for identifying object regions within the elevation map; and
(b2) means for processing the object regions by classifying color, features and texture within said object regions.

17. The apparatus of claim 14 wherein the object in the site are buildings and the apparatus further comprises:
(d) means for processing the oblique imagery to produce a root model for each building in the site.

18. The apparatus of clam 17 wherein means (d) further comprises:
(d1) means for selecting a building within the site;
(d2) means for detecting edges of the building within the oblique imagery;
(d3) means for identifying a set of roof model hypotheses that correspond to the edges;
(d4) means for selecting and fitting each roof model hypothesis to the oblique imagery to identify a roof model hypothesis as the roof model.

19. The apparatus of claim 18 wherein the means (d1) selects a building based upon visibility within the oblique imagery.

20. The apparatus of claim 17, wherein means (d) further comprises:
(d1) means for selecting a building within the site;
(d2) means for extracting a range map from the oblique imagery;
(d3) means for mapping pixel locations within the range map to a common orthographic coordinate apparatus;
(d4) means for extracting multiple planes from the range map using regression to fit the planes to form a roof model.

21. The apparatus of claim 14 further comprising an elevation information source.

22. The apparatus of claim 14 further comprising
(d) means for deriving range information from the oblique imagery;
(e) means for sweeping a horizontal plane through a point cloud in the range information;
(e1) means fry identifying intersections of the point clouds with the horizontal plane to determine edges of the point density within the point cloud;
(f) means for processing a point density to identify object locations within the site.

23. The apparatus of claim 22 wherein means (f) further comprises:
(f1) means for fitting rectangular boxes to edges of the point density where the rectangular boxes represent objects within the site.

24. The apparatus of claim 22 wherein means (f) further comprises:
(f1) means for analyzing the point density to identify object shapes and sizes.

25. The apparatus of claim 24 wherein means (f1) further comprises:
(f11) means for sweeping at least one additional plane through the point cloud in the range information to produce point densities representing planes of objects within the site.

26. the apparatus of claim 14 further comprising a means for producing a plan view model using graphical analysis.

* * * * *

UNITED STATES PATENT AND TRADEMARK OFFICE
CERTIFICATE OF CORRECTION

PATENT NO. : 7,509,241 B2  Page 1 of 1
APPLICATION NO. : 10/191397
DATED : March 24, 2009
INVENTOR(S) : Yanline Guo et al.

It is certified that error appears in the above-identified patent and that said Letters Patent is hereby corrected as shown below:

Col. 8, LN 59, please change:
"tot" to "for"

Col. 10, LN 35, please change:
"fun her" to "further"

Signed and Sealed this

Second Day of June, 2009

JOHN DOLL
*Acting Director of the United States Patent and Trademark Office*